US006837608B2

United States Patent
Chang et al.

(10) Patent No.: US 6,837,608 B2
(45) Date of Patent: Jan. 4, 2005

(54) HEAT-SINKING APPARATUS FOR LIGHT PIPE

(75) Inventors: Hung Chang, Taipei (TW); Li-Kuan Wong, Keelung (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 10/302,815

(22) Filed: Nov. 22, 2002

(65) Prior Publication Data

US 2003/0098956 A1 May 29, 2003

(30) Foreign Application Priority Data

Nov. 23, 2001 (TW) .......................... 90129127 A

(51) Int. Cl.⁷ .............................. F21V 29/00; F21V 8/00
(52) U.S. Cl. ...................... 362/580; 362/581; 362/294; 362/373
(58) Field of Search ............................. 362/580, 581, 362/294, 373; 385/901

(56) References Cited

U.S. PATENT DOCUMENTS

| | | | | | |
|---|---|---|---|---|---|
| 3,681,592 | A | * | 8/1972 | Hugelshofer | 362/580 |
| 5,740,296 | A | * | 4/1998 | Harris | 385/116 |
| 6,217,205 | B1 | * | 4/2001 | Ward | 362/580 |
| 6,422,719 | B1 | * | 7/2002 | Hung et al. | 362/373 |
| 6,616,317 | B2 | * | 9/2003 | Feinbloom et al. | 362/580 |

FOREIGN PATENT DOCUMENTS

WO    WO 0140861    6/2001

* cited by examiner

Primary Examiner—Thomas M. Sember
(74) Attorney, Agent, or Firm—Snell & Wilmer L.L.P.

(57) ABSTRACT

The present invention provides a heat-sinking apparatus for a light pipe. The light pipe is disposed on an optical engine of a projector and optically couples with a light source. The heat-sinking apparatus includes a cover made of a heat conductive material and a fan. The cover covers the light pipe and uniformly distributes thermal energy generated by the light source over the light pipe. The fan dissipates the thermal energy distributed over the light pipe.

13 Claims, 5 Drawing Sheets

HEAT-SINKING APPARATUS FOR LIGHT PIPE

CROSS REFERENCE TO RELATED APPLICATIONS

This application claims priority to Taiwan Patent Application No. 090129127 entitled "Heat-sinking Apparatus for Light Pipe", filed Nov. 23, 2001.

FIELD OF INVENTION

The present invention generally relates to a heat-sinking apparatus for a light pipe and, more particularly, to a heat-sinking apparatus for a light pipe used in a Digital Light Processing (DLP) projector.

BACKGROUND OF THE INVENTION

A cathode-ray tube (CRT) has typically been used in projection technology in the past. However, CRT projectors generally have dimensions of large size and have relative low resolution, and therefore have been gradually replaced by liquid crystal display (LCD) projectors in recent years.

The liquid crystal display technology involves transmitting incident light from a light source through a trichromatic filter, then projecting three primary colors (Red, Green, Blue) to three liquid crystal display panels (LCD panels), and integrating these three primary colors to form an image. Generally speaking, the color saturation and the color temperature of the liquid crystal display projector are better. However, a transmission-type liquid crystal display panel is restricted by the light transmission ratio, which lowers the luminous efficiency compared with a reflective-type liquid crystal display panel. Besides, the size and the weight of the transmission-type liquid crystal display panel cannot be reduced due to the structure limitation of the optical engine.

Recently, another type of projection technology, i.e., a digital light processing (DLP) technology, has been developed. Detail background information of the DLP technology can be found in U.S. Pat. No. 5,658,063. The digital light processing technology was invented by Texas Instruments Incorporated located in Dallas, Tex., the United States. Different from the liquid crystal display technology, in the digital light processing technology, the light is reflected by the digital light processing chip to form an image on a surface. The key element of this technology is a semiconductor device controlled by a binary impulse adjustment, and this device is called Digital Micromirror Device (DMD).

The Digital Micromirror Device chip functions as a reflective digital optical switch, which can precisely control the light. The micromirrors of the Digital Micromirror Device in the digital light processing projector reflect the light to form an image on a surface. This technology has benefits of size and weight reductions of the projector and also provides higher luminous efficiency and higher resolution. The Digital Micromirror Device is a reflective-type optical device with high filling ratio. This property provides a higher luminous efficiency, so that the digital light processing projector can be used in areas which require high brightness and high resolution. Furthermore, the digital light processing technology has improved heat dissipation ability. This property allows the use of a light source with high watts while not decreasing the lifetime of the Digital Micromirror Device. Moreover, because the digital light processing technology is completely a digital design, the regeneration images are more stable and accurate.

In a digital light processing projector, a light pipe is an important refractive optical element. The light pipe is usually disposed between the light source and the optical engine. Generally, the light pipe is constructed by four pieces of glass. A holding device and a bracket are used to position the light pipe in the DLP projector, and screws are used to adjust the horizontal and vertical positions of the light pipe.

Refer to FIG. 1a and FIG. 1b, which are schematic diagrams of a prior art light pipe 13 disposed on an optical engine 12. As shown in FIG. 1a, the rigid holding device 11 maintains the light pipe 13 on the surface 121 of the optical engine 12 which is made of aluminum and magnesium alloy. Therefore, the light pipe 13 optically couples with the light source (not shown) in order to transmit the refracted light. Screws 14 and 15 are used to adjust the horizontal and vertical positions of the light pipe 13, respectively. As shown in FIG. 1b, the light pipe 13 is constructed of four pieces of glass held together by adhesive. The temperature at portions of the light pipe 13 close to the light source is commonly higher than those at other portions. When the temperature is over the heat resistance of the adhesive, side glass 131 and 133 of the light pipe 13 might be broken down because of side stresses.

Therefore, a heat-sinking apparatus is desired for the light pipe 13 to uniformly distribute the thermal energy generated by the light source over the light pipe 13. Moreover, a heat-sinking apparatus is desired to dissipate the thermal energy distributed over the light pipe 13, and to reduce the thermal effect on the adhesive for preventing the breakdown of the light pipe 13.

SUMMARY OF THE INVENTION

It is therefore an aspect of the present invention to provide a simple heat-sinking apparatus for a light pipe to uniformly distribute thermal energy generated by the light source over the light pipe, and further to dissipate the thermal energy distributed over the light pipe.

The present invention provides a heat-sinking apparatus for a light pipe to prevent the breakdown of the light pipe. The heat-sinking apparatus for the light pipe of the present invention includes a cover made of heat conductive material. By covering the light pipe with the cover, thermal energy generated by the light source is uniformly distributed over the light pipe.

It is another aspect of the present invention to provide a heat-sinking apparatus made of commercial materials, such as a metal sheet of excellent heat conduction ability, which simplifies the production process. In a preferred embodiment of the present invention, the cover is made of aluminum foil.

It is a further aspect of the present invention to provide a heat-sinking apparatus, which further includes a fan for dissipating the thermal energy distributed over the light pipe and effectively dissipates thermal energy to prevent the breakdown of a light pipe.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1b is a schematic diagram of the light pipe shown in FIG. 1a;

DETAILED DESCRIPTION

A light pipe is an important optical refractive element in a digital liquid processing projector. Generally, the light pipe is disposed on a base surface of an optical engine, and optically couples with a light source. The incident light from the light source is refracted by the internal surface of the light pipe, then through a trichromatic rotation wheel of the optical engine, to a digital micromirror device (DMD) chip, which reflects the light to form an image on a screen. Four pieces of glass are typically constructed together using adhesive to form the light pipe. Therefore, when the temperature of the light pipe is over the heat resistance of the adhesive, the light pipe is likely to breakdown. The present invention provides a heat-sinking apparatus for the light pipe, which eliminates the disadvantages of the prior art, and further prevents Blue Edge phenomenon induced by the breakdown of the light pipe.

Figure 1A:
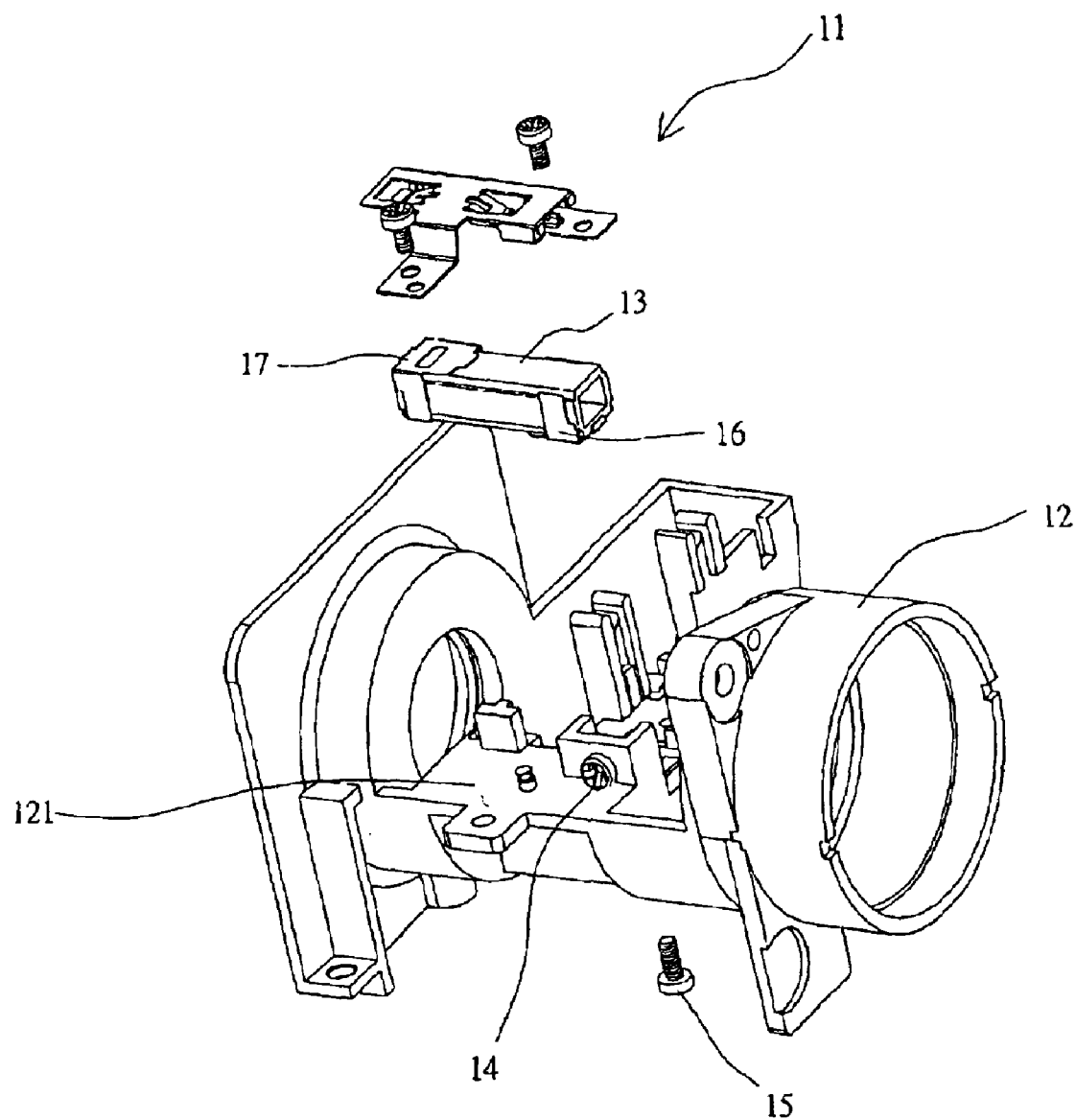
FIG. 1a is a schematic diagram of a light pipe and an optical engine of the prior art.
Figure 1B:
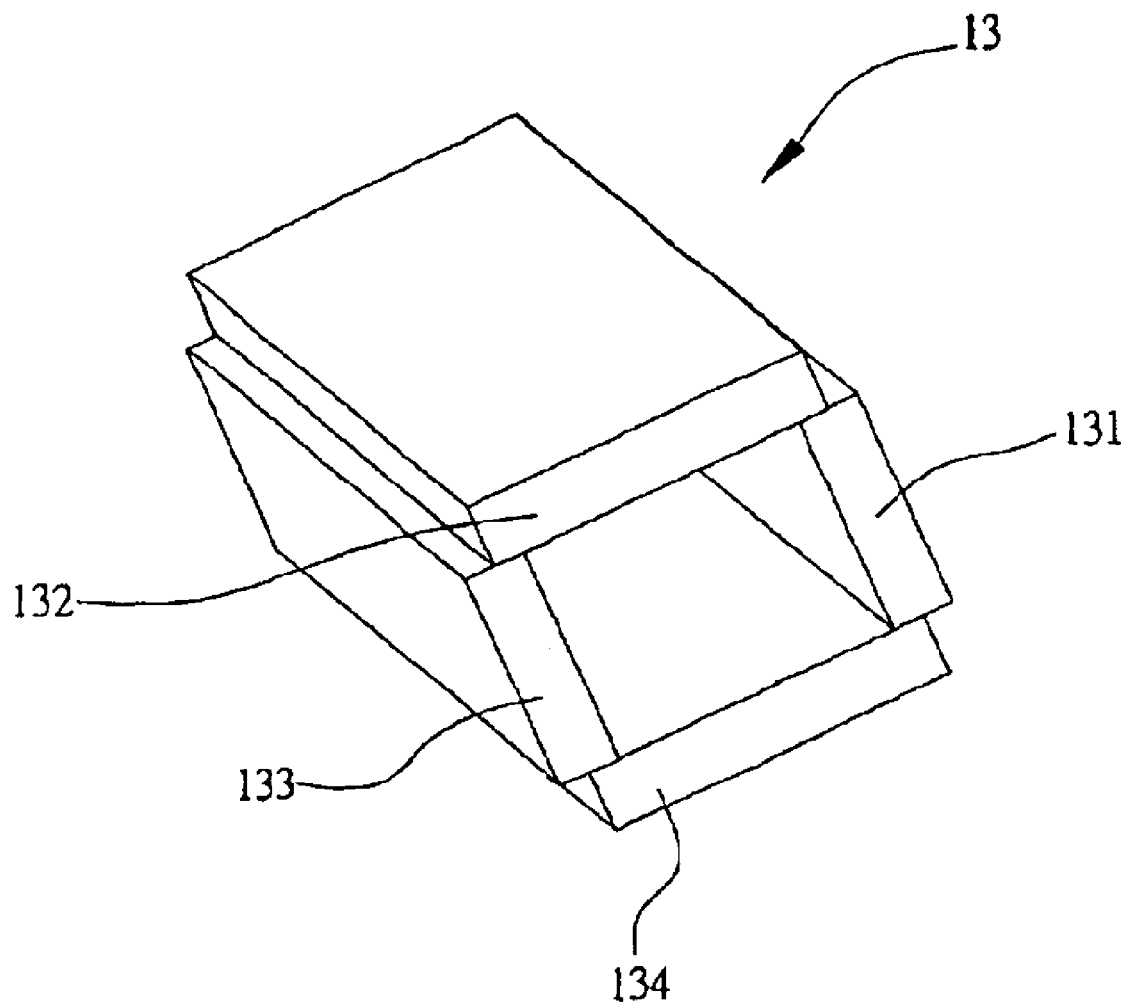
Figure 2A:
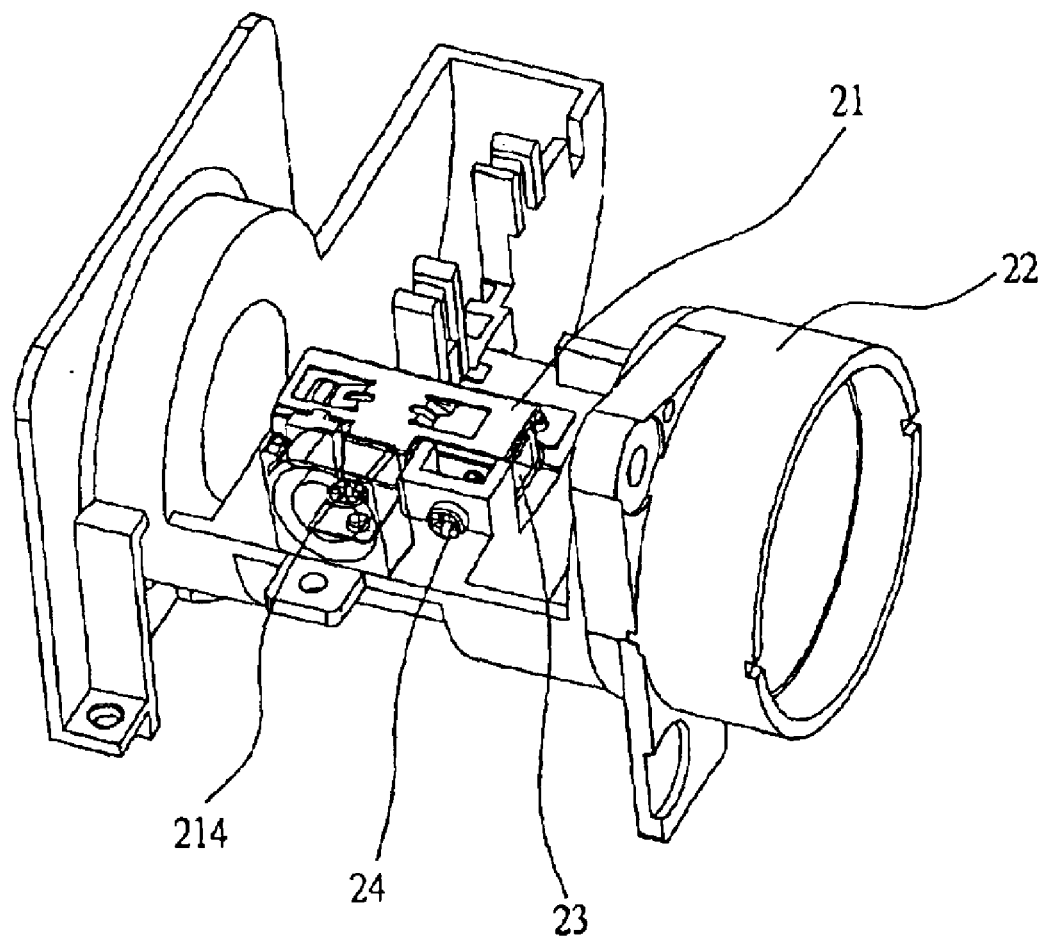
FIG. 2a is a schematic diagram of one embodiment of the present invention.
Figure 2B:
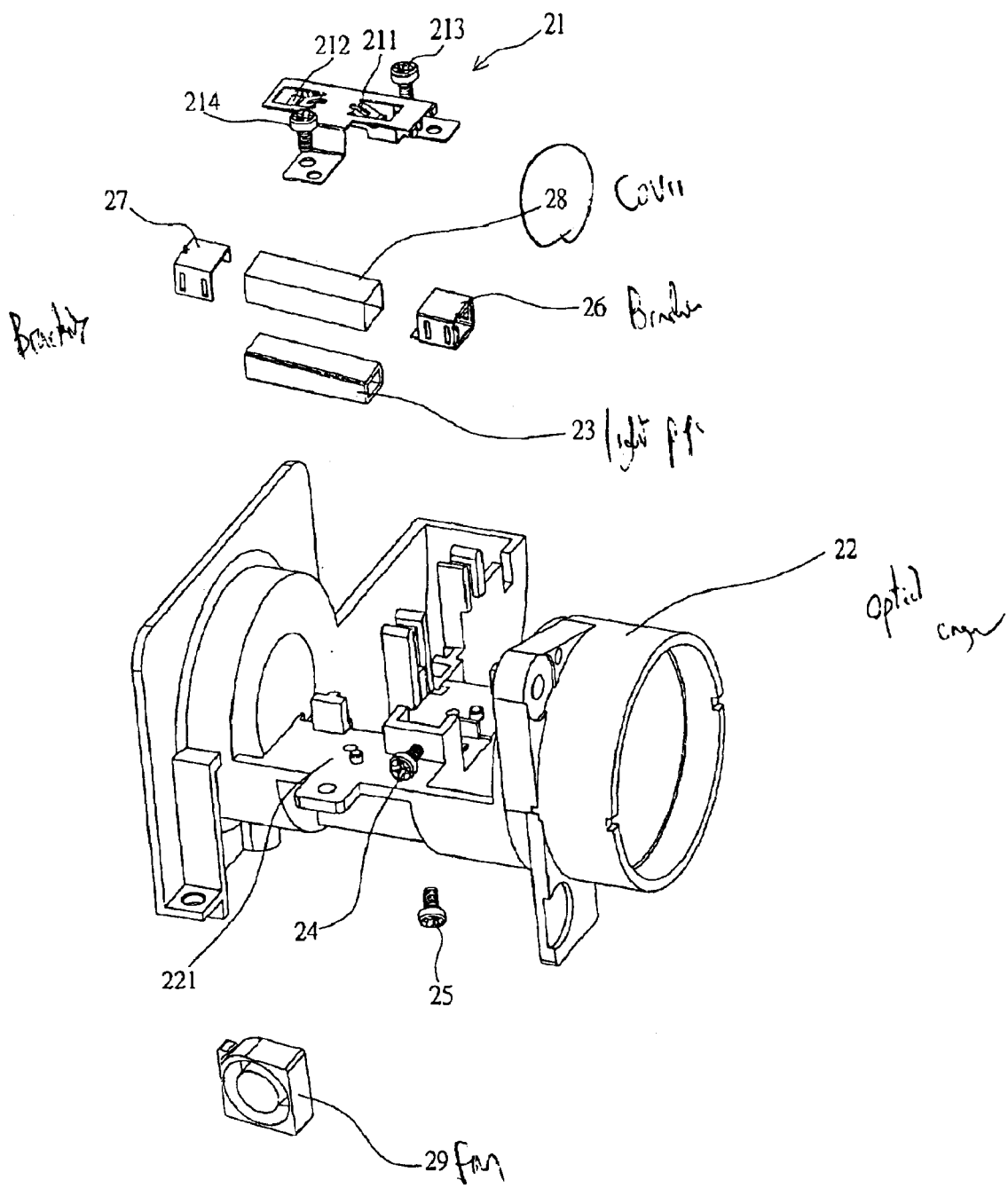
FIG. 2b is an exploded view of one embodiment of the present invention.

Referring to FIG. 2a and FIG. 2b, a light pipe 23 is positioned on surface 221 of an optical engine 22 with a holding device 21 and brackets 26, 27 to optically couple with the light source (not shown) for transmitting and refracting the light. The holding device 21, the optical engine 22, the light pipe 23, and the brackets 26, 27 are similar to the holding device 11, the optical engine 12, the light pipe 13, and the brackets 16, 17 of the prior art. Different from the prior art, the present invention includes a heat-sinking apparatus to reduce the thermal effect on the adhesive, and to efficiently prevent the breakdown of the light pipe 23.

As shown in FIG. 2a and FIG. 2b, in one embodiment of the present invention, the heat-sinking apparatus includes a cover 28 made of heat conductive material. The holding device 21 includes leaf spring 211, 212 and screws 213, 214. The brackets 26, 27 are adhered to two ends of the light pipe 23, respectively. The leaf springs 211, 212 flexibly contact the brackets 26 and 27, respectively. The brackets 26, 27, the light pipe 23, and the cover 28 are secured on the surface 221 of the optical engine 22 by screws 213, 214.

Figure 3:
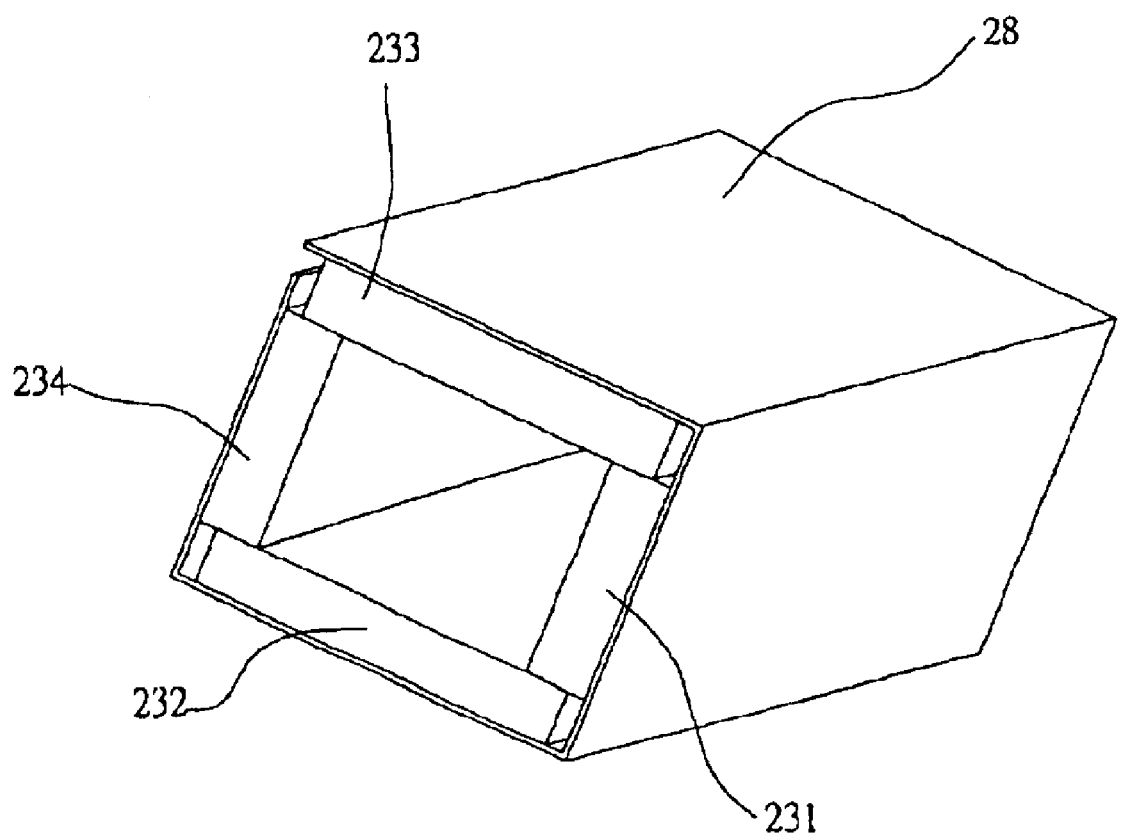
FIG. 3 is a schematic diagram of a light pipe and a cover of the present invention.

Therefore, the light pipe 23 is positioned by the holding device 21 and optically couples with the light source (not shown). As shown in FIG. 3, the cover 28, which is made of heat conductive material, covers the light pipe 23 to uniformly distribute thermal energy generated by the light source over the light pipe 23, and prevents the portions of the light pipe 23 close to the light source from over heating.

In accordance with one embodiment of the present invention, the cover 28 is made of metal material with excellent heat conduction ability, such as aluminum foil. Aluminum foil is a suitable material for the cover 28, because of its great heat resistance, flexibility of attachment, and easy to acquire and manufacture. Besides, the thickness of the aluminum foil employed in the present invention is only 0.05 millimeters (mm), and even for a light pipe with small size, the accuracy of the small-sized light pipe is well controlled. Furthermore, the cover 28 made of aluminum foil can reduce stray light into the light pipe 23.

In a preferred embodiment of the present invention, the heat-sinking apparatus further includes a heat convection device, such as a fan 29, which is disposed on the surface 221 of the optical engine 22. The fan 29 generates heat convection to dissipate the thermal energy distributed over the light pipe 23 and the cover 28, and to reduce the temperature to less than the heat resistance of the adhesive, which prevents the breakdown of the light pipe 23.

Using the aforementioned description to protect the light pipe 23 can prevent the breakdown of the light pipe, and increase the selectivity of the adhesive for connecting the four pieces of glass of the light pipe. Although specific embodiments have been illustrated and described, it will be obvious to those skilled in the art that various modifications may be made without departing from what is intended to be limited solely by the appended claims.

What is claimed is:

1. A heat-sinking apparatus for a light pipe that includes a plurality of parts adhered together and disposed on an optical engine of a projector for optically coupling with a light source, the heat-sinking apparatus comprising:

a cover made of a heat conductive material, wrapping around the light pipe, for uniformly distributing thermal energy generated by the light source over the light pipe;

a bracket positioned on one end of said light pipe; and a holding device, contacting said bracket, for positioning said bracket, said light pipe and said cover on said optical engine.

2. The heat-sinking apparatus of claim 1, wherein the cover is made of metal.

3. The heat-sinking apparatus of claim 2, wherein the cover is made of aluminum foil.

4. The heat-sinking apparatus of claim 1 further comprising a heat convection device for dissipating thermal energy distributed over the light pipe.

5. The heat-sinking apparatus of claim 4, wherein the heat convection device is a fan.

6. The heat-sinking apparatus of claim 1, wherein said holding device includes a leaf spring for contacting said bracket.

7. The heat-sinking apparatus of claim 1, wherein said holding device is made of thermal conductive material.

8. A heat-sinking apparatus for a light pipe, the light pipe having a plurality of side walls adhered together, and one end of the light pipe optically coupling with a light source, the heat-sinking apparatus comprising:

a cover made of a heat conductive material for covering the side walls of the light pipe for uniformly distributing thermal energy generated by the light source over the light pipe;

a heat convection device for dissipating the thermal energy distributed over the light pipe;

a bracket positioned on one end of said light pipe; and a holding device, contacting said bracket, for positioning said bracket, said light pipe and said cover on said optical engine.

9. The heat-sinking apparatus of claim 8, wherein the cover is made of aluminum foil.

10. The heat-sinking apparatus of claim 8, wherein the heat convection device is a fan.

11. The heat-sinking apparatus of claim 8, wherein said holding device includes a leaf spring for contacting said bracket.

12. The heat-sinking apparatus of claim 8, wherein said holding device is made of thermal conductive material.

13. A light pipe for a projector that comprises an optical engine and a light source, said light pipe being disposed on said optical engine and optically coupling with said light source, said light pipe comprising a multiplicity of parts adhered together and a conductive foil wrapping around said multiplicity of parts for uniformly distributing thermal energy generated by said light source so as to prevent said light pipe from breakdown.

* * * * *